(12) United States Patent
Hampel et al.

(10) Patent No.: US 9,344,108 B2
(45) Date of Patent: May 17, 2016

(54) DEVICE HAVING A DELTA-SIGMA MODULATOR AND A SWITCHING AMPLIFIER CONNECTED THERETO

(71) Applicant: iAd Gesellschaft für Informatik, Automatisierung und Datenverarbeitung mbH, Grosshabersdorf (DE)

(72) Inventors: Hermann Hampel, Grosshabersdorf (DE); Ulrich Berold, Nuremberg (DE); Abdul Rahman Hanoun, Heilsbronn (DE); Johannes Hampel, Grosshabersdorf (DE); Oliver Eckhof, Gutenstetten (DE); Manfred Deinzer, Neunkirchen am Sand (DE); Andreas Bänisch, Fürth (DE)

(73) Assignee: IAD GESELLSCHAFT FÜR INFORMATIK, AUTOMATISIERUNG UND DATENVERARBEITUNG MBH, Grosshabersdorf (DE)

( * ) Notice: Subject to any disclaimer, the term of this patent is extended or adjusted under 35 U.S.C. 154(b) by 0 days.

(21) Appl. No.: 14/365,729
(22) PCT Filed: Dec. 15, 2012
(86) PCT No.: PCT/EP2012/005182
§ 371 (c)(1),
(2) Date: Jun. 16, 2014
(87) PCT Pub. No.: WO2013/087221
PCT Pub. Date: Jun. 20, 2013

(65) Prior Publication Data
US 2014/0354353 A1 Dec. 4, 2014

(30) Foreign Application Priority Data
Dec. 15, 2011 (DE) .................. 10 2011 121 139

(51) Int. Cl.
*H04B 14/06* (2006.01)
*H03M 3/00* (2006.01)
(Continued)

(52) U.S. Cl.
CPC .............. *H03M 3/368* (2013.01); *H03F 3/2171* (2013.01); *H03M 3/506* (2013.01); *H03M 5/06* (2013.01); *H03M 7/3026* (2013.01)

(58) Field of Classification Search
CPC ................... G11B 20/1426; G11B 2020/1457; G11B 2020/1287; H03M 5/145; H03M 13/25; H04L 7/041; H04L 25/03343; H04L 25/4927; H04L 25/4975; H04B 14/04
USPC ................. 375/237–238, 242–254, 295–312, 375/354–376
See application file for complete search history.

(56) References Cited

U.S. PATENT DOCUMENTS

| 5,815,102 A | 9/1998 | Melanson |
|---|---|---|
| 6,150,969 A | 11/2000 | Melanson |

(Continued)

FOREIGN PATENT DOCUMENTS

| DE | 69919185 T2 | 6/2006 |
|---|---|---|
| GB | 2406008 A | 3/2005 |

(Continued)

*Primary Examiner* — James M Perez
(74) *Attorney, Agent, or Firm* — Rankin, Hill & Clark LLP

(57) ABSTRACT

A delta-sigma modulator for a switching amplifier, which achieves a high signal-to-noise ratio (SNR) in the multi-MHz range and keeps the noise-transfer function over the useful frequency range as low and as flat as possible. A series connection of a parallel-serial converter and a downstream swap element for the serial output signal $y_{a2}$ of the parallel serial converter is connected to the multi-bit output of the delta-sigma-modulator. The swap element swaps, based on the last bit value 0 or 1 of a preceding word in the resulting output signal $y_{a3}$, the sequence of the binary zeroes and ones of the current word, where present, and then an input signal is fed to the delta-sigma-modulator. The signal is capable of having a frequency range above 25 kHz, and is prepared with a low oversampling ratio and a high SNR. And, 1-0 or 0-1 transitions are largely eliminated at the word boundaries.

13 Claims, 12 Drawing Sheets

(51) Int. Cl.
  *H03F 3/217* (2006.01)
  *H03M 5/06* (2006.01)
  *H03M 7/30* (2006.01)

(56) References Cited

U.S. PATENT DOCUMENTS

| | | | |
|---|---|---|---|
| 7,327,296 B1 * | 2/2008 | Gaboriau et al. | 341/143 |
| 7,894,545 B1 * | 2/2011 | Groe | 375/295 |
| 8,416,880 B2 * | 4/2013 | Vromans | 375/295 |
| 8,781,031 B2 * | 7/2014 | Casagrande | 375/334 |
| 8,976,898 B1 * | 3/2015 | Wilson et al. | 375/297 |
| 9,182,295 B1 * | 11/2015 | Perrott et al. | |
| 2005/0207480 A1 * | 9/2005 | Norsworthy | H03H 17/0614 375/219 |
| 2009/0051423 A1 * | 2/2009 | Miaille et al. | 330/10 |
| 2009/0243903 A1 * | 10/2009 | Khoury | 341/143 |
| 2010/0066580 A1 | 3/2010 | Brooks et al. | |
| 2010/0085118 A1 | 4/2010 | Chiu | |
| 2012/0056676 A1 * | 3/2012 | Frambach | 330/295 |
| 2012/0076339 A1 * | 3/2012 | Buck et al. | 381/369 |
| 2012/0300858 A1 * | 11/2012 | Morgan | 375/242 |

FOREIGN PATENT DOCUMENTS

| | | |
|---|---|---|
| GB | 2435559 A | 8/2007 |
| GB | 2438774 A | 12/2007 |
| WO | 2010/109453 A1 | 9/2010 |

* cited by examiner

DEVICE HAVING A DELTA-SIGMA MODULATOR AND A SWITCHING AMPLIFIER CONNECTED THERETO

BACKGROUND OF THE INVENTION

1. Field of Invention

The invention relates to a device comprising a delta-sigma modulator, and a switching member connected to the latter amplifier, in particular for processing the input signal with low oversampling ratio (OSR) and high signal-to-noise ratio (SNR).

2. Brief Description of the Related Art

Due to the fact that a switching amplifier, in particular a MOSFET output stage in the switching mode, only a very low power in the off state ("Cut-off state") and saturation state consumes, it offers better efficiency than linear-amplifier. In theory, power is consumed only when switching between these states.

Often a PDM (Pulse Duration Modulation)—module and/or DSM (delta-sigma) modulator module, which converts the high-resolution signal to a signal having a low resolution (1-bit pulse train) at a much higher frequency, is directly connected before a switching amplifier (digital amplifier) in the switching operation. The power amplifier is often followed by a low pass reconstruction filter, which restores the amplified baseband signal.

Delta-sigma modulators, referred to as "DSM", shape the signal-to-noise ratio (SNR) so as to push away the noise in the frequency range of the signal. In the reference book "Understanding Delta-Sigma Data Converters" by Richard Schreier, Gabor Temes, Wiley Interscience Publication 2005, ISBN 0-471-46585-2 will be presented more conventional DSM-structures. The structures described here aimed at baseband signals with low sampling rates. Relatively high oversampling ratios with high order of the DSM (e.g. over the 16) are used to guarantee an acceptable SNR of the output signals. In the case of a very high sampling rate of the baseband signal (over the 2 MSps (Mega-samples per second)), however, only low oversampling ratios are technically feasible for the power amplification. The electrical characteristics of the most power amplifier transistors cause for high frequency input pulses to have a strong deterioration of the quality of the output signal and the gain efficiency.

The low sampling rate (RSR; Reduced sampling rate) designed DSM (DSM-RSR) provides the same SNR magnitude with a much lower OSR. In the essay "A Reduced-Sample-Rate Sigma-Delta-Pipeline ADC Architecture for High-Speed High-Resolution Applications" by Vahid Majidzadeh, Omid Shoaei published in IEICE Transactions 89-C (6): 692-701 (2006), there are shown two practical examples for RSR loop filter. The RSR-DSM 4th and $6^{th}$ order provides, compared to the conventional DSM-loop filters, a higher SNR for a low OSR.

The use of multi-bit quantization in the DSM increases the SNR and improves the stability of the DSM as discussed in the article "Delta-Sigma modulator: modeling, design and application" of George Bouropoulos published in Imperial College Press, 2003, ISBN 1-86094-369-1 and as discussed in the doctoral thesis "Stability Analysis and Design of bandpass sigma delta modulator" by Jürgen van Engelen, Eindhoven University of Technology, 1999, ISBN 90-386-1580-9. However, each bit of the multi-bit output of the DSM requires a separate power amplifier per channel with weighted power supply. The above solution is very costly and is not recommended for technical aspects.

A fundamental remedy to this drawback is to place a parallel-to-serial converter at the output of the multi-bit DSM and before the MOSFET output stage in the switching mode CDA and thus feed a 1-bit pulse stream in the CDA. This concept is explained briefly in the thesis "Stability Analysis and Design of bandpass sigma delta modulator" by Jürgen van Engelen, whereas this concept, for example, is used in some patent applications such as GB-A-2438774, GB-A-2435559 or GB-A-2406008.

To find the optimal coefficients for the loop filter in the DSM, a search algorithm can be used, as this for example is explained in the essay "An Automatic Coefficient Design Methodology for High-order Bandpass Sigma-Delta modulator with single-Stage Structure" by Hwi-Ming Wang published in IEEE Transactions on Circuits and Systems II, July 2006, pages 580-584 or by Wan-Rone Liou, "A Low-Power Delta-sigma modulator Multi-Bit with Data Weighted Averaging Technique", Workshop on Consumer Electronics and Signal Processing, 2005, Taiwan.

In the prior art a DSM is often used with a multi-bit signal at the output and often signals audio are to amplified, so there is still a significantly lower frequency range, lower bandwidth and correspondingly lower sampling rates as well. The solutions described in the patent applications GB-A-2438774, GB-A-2435559 or GB-A-2406008 the P/S conversion has a strong influence on the structure of the loop filter and its parameters. Furthermore, in these patent applications GB-A-2,438,774, GB-A-2,435,559 or GB-A 2,406,008 the control of flipping requires a complex control/logic.

Furthermore, from U.S. Pat. No. 5,815,102 a digital-to-analog (D/A)-converter, in particular a Delta-Sigma-Converter used for audio signals and a reduced switching is known. In the human hearing audio frequencies lies in a range of 16 Hz to 20 kHz. Such a D/A converter is considered to be particularly useful for such hearing aids, which—in order to receive an ambient sound—comprising an audio receiver or receivers having an analog-to-digital converter to convert the sound sequences or sound in a digital signal lower rate and high resolution, having a digital processing circuitry to modify the quality of the digital signal showing a low-rate and high resolution, having an interpolator to convert the digital signal showing a low-rate and high resolution in a signal showing high definition and a medium rate, and having a digital-to-analog converter to convert back the modified digital signal showing a medium rate and high resolution into an analog sound. To make a digital-to-analog (D/A)-converter available, which has a low power consumption due to a reduction in the number of output signal transitions and while a low bias is maintained, according to U.S. Pat. No. 5,815,102, in the hearing aid a duty cycle demodulator formatted a digital signal showing low resolution and a high rate in a predetermined format of a low transition rate. For this purpose a multi-bit value corresponding to each input or input value of the digital signal showing a medium resolution and medium rate is determined and the values thus determined are outputted as a digital signal of low resolution and high rate. For example, the duty cycle demodulator store a value corresponding to each possible input value of the digital signal having medium resolution and medium rate (for example, in ROM) and look up the corresponding stored value for each inputted digital signal having medium resolution and medium rate. The conversion of the input values into output values is done by so-called "format" of the input signal, which is performed by looking up the stored values. In this alternate format grow odd cycles from the right and even cycles from the left.

Finally, from U.S. 2010/0066580 A1, an audio digital-to-analog (D/A)-converter is known, which converts digital audio signals into analog audio signals. Oversampling techniques are typically used in an audio D/A-converter in order to improve the accuracy of the analog output signal, so that it accurately represents the digital signal at the input of the D/A converter. The method used in U.S. 2010/0066580 A1 requires a table having a plurality of sequences for each quantization levels of the input signal and in each case have a positive and negative sequence. In addition, each alternating between sequences with positive and negative "common mode energy" (common mode energy), the sequences in the same "set" all begin with the same binary value, and all ends with the same binary value. Since these 2 bits per sequence are already established, a higher clock frequency of the output signal is required, whereas in consideration of low-frequency audio signals in the U.S. 2010/0066580 A1 this does not affect a hindrance.

The fundamental problem is the realization of high frequencies in the output stage. In principle, the highest possible quantization in the DSM for a better signal quality (SNR) was desired at the output, i.e. a highest possible resolution of the quantizer and hence as many bits at the output of the DSM. However, the higher the quantization is the greater is the required frequency to drive the output stage (if the resolution of the output stage is lower than that of the quantizer as is given in the case under consideration).

Furthermore also the chip pads (more precisely, the Die-Pads) have a low-pass characteristic, whereas the cut-off frequency of this low pass depends on the chip technology used in each case. The higher the oversampling ratio (OSR) and thus the higher clock frequency of the pad are, the greater is the frequency range in which due to the low-pass characteristic in the Die-Pad the filtering of the pulses is problematic. A reduction in the over-sampling ratio (OSR) inevitably leads to a low power loss and signal distortion in the switching amplifier.

In summary it can be stated that in the prior art, considering the amplifying of audio signals, significantly lower range of the useful signal and sampling frequencies are present, so that the realization of the required frequencies even at high oversampling ratio (OSR) is rather straightforward. For power electronics higher frequencies (as in the audio range) are a major challenge, since—through higher switching frequencies—signal distortions arise at the input of the amplifier.

BRIEF SUMMARY OF THE INVENTION

It is an object of the invention to configure a delta-sigma-modulator for a switching amplifier such that, in the region of several MHz, a higher signal-to-noise ratio SNR is obtained and the Noise-Transfer-Function (NTF) over the useful frequency range is as low as possible and flat. The final stage is to be structured such that a substantial increase in energy efficiency, a reduction of the power loss and a variable supply voltage range and thus an adaptation of the dynamics with the same SNR can be achieved.

This object is achieved by an apparatus comprising a delta-sigma-modulator and a switching amplifier connected thereto, wherein at the multi-bit-output of the delta-sigma-modulator a series connection of a parallel-serial converter and a subsequent swap element for the serial output signal of the parallel-serial-converter is connected, and wherein the swap element, based on the last bit value 0 or 1 of a preceding word in the resulting output signal $y_{a3}$, reverses the sequence of binary zeroes and ones of the current word (if any), whereby an input signal fed to the delta-sigma-modulator, said signal being capable of having a frequency range above 25 kHz, is prepared with a low oversampling ratio of preferably 8 and a high signal-to-noise ratio such 1-0 or 0-1 transitions at the word boundaries are eliminated as far as possible.

Furthermore, this object is solved by an apparatus comprising a delta-sigma-modulator and a switch amplifier connected thereto, wherein at the multi-bit-output of the delta-sigma-modulator a series connection of a swap element for the parallel output signal $y_{b1}$ of the delta-sigma-modulator and a subsequent parallel-to-serial converter is connected, and wherein the swap element, based on the last bit value 0 or 1 of a preceding word in the resulting output signal $y_{b3}$, reverses the sequence of binary zeroes and ones of the current word (if any), whereby an input signal fed to the delta-sigma-modulator, said signal being capable of having a frequency range above 25 kHz, is prepared with a low oversampling ratio of preferably 8 and a high signal-to-noise ratio such 1-0 or 0-1 transitions at the word boundaries are eliminated as far as possible.

Furthermore, this object is solved by an apparatus comprising a delta-sigma-modulator and a switching amplifier connected thereto, wherein at the multi-bit-output of the delta-sigma-modulator modulator a parallel connection of K modulation tables, a subsequent multiplexer, which is controlled by a control unit in each case for selecting the output of a modulation table, and said multiplexer a parallel-serial converter is downstream connected, whereby an input signal fed to the delta-sigma-modulator, said signal being capable of having a frequency range above 25 kHz, is prepared with a low oversampling ratio of preferably 8 and a high signal-to-noise ratio such 1-0 or 0-1 transitions at the word boundaries are eliminated as far as possible.

The inventive devices allow a significant increase in energy efficiency, reduction in power consumption and a variable supply voltage range and thus an adaptation of the dynamics with the same SNR. The delta-sigma-modulator functions as a converter which converts signals in a certain resolution into other signals of other resolution or converts input signals present in a certain form into output signals of other form, which signals maintain their information. In particular the conversion of infinite resolution of analog signals into digital signals has limited resolution. The conversion is performed such that the characteristics of the signal for the subsequent switching amplifier are optimized.

The invention is not restricted to a type of delta-sigma modulators DSMs, but can be implemented with any DSMs, at least meet a specific criterion. This criterion is a low sampling rate, as between delta-sigma modulator and switching amplifiers (digital amplifier) a parallel-serial conversion is done its required clock frequency (with the respectively considered technology) must be implemented, as well as of the switching amplifier.

BRIEF DESCRIPTION OF THE DRAWING FIGURES

Further advantages and details can be given by the following description of preferred embodiments of the invention with reference to the drawings. In the drawings.

Figure 2:
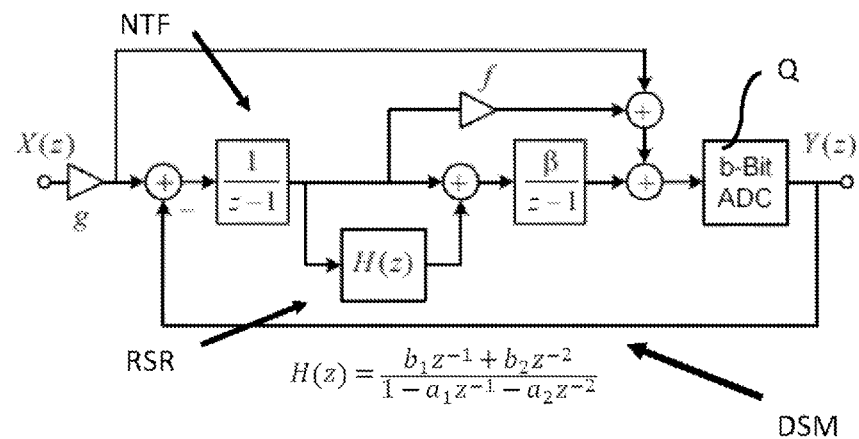
FIG. 2 shows an embodiment of the architecture of the DSM according to FIG. 1.
Figure 3:
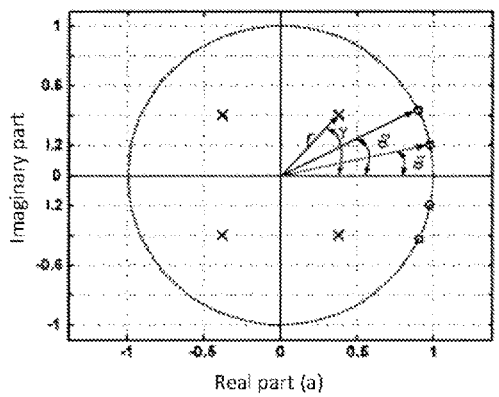
Figure 3:
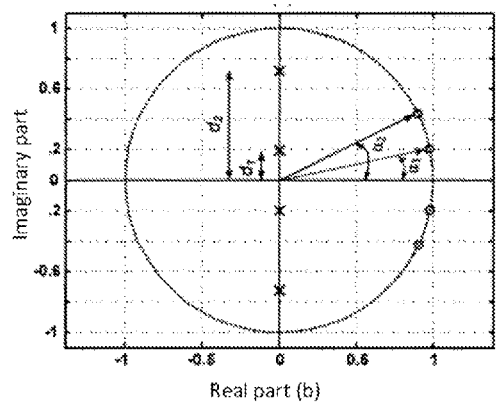
Figure 4A:
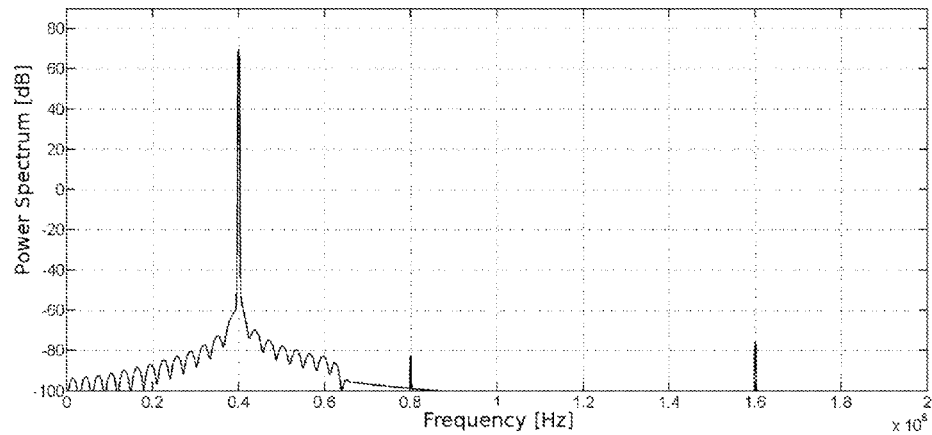
Figure 4B:
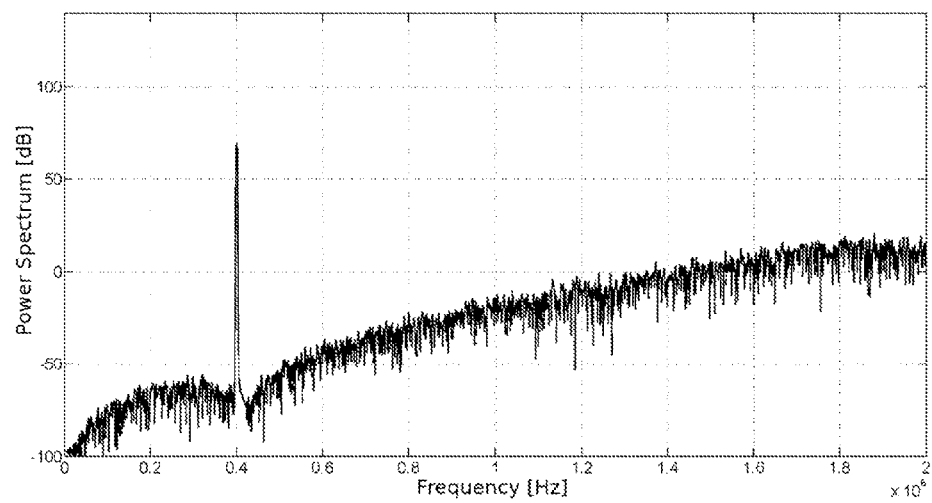
Figure 4C:
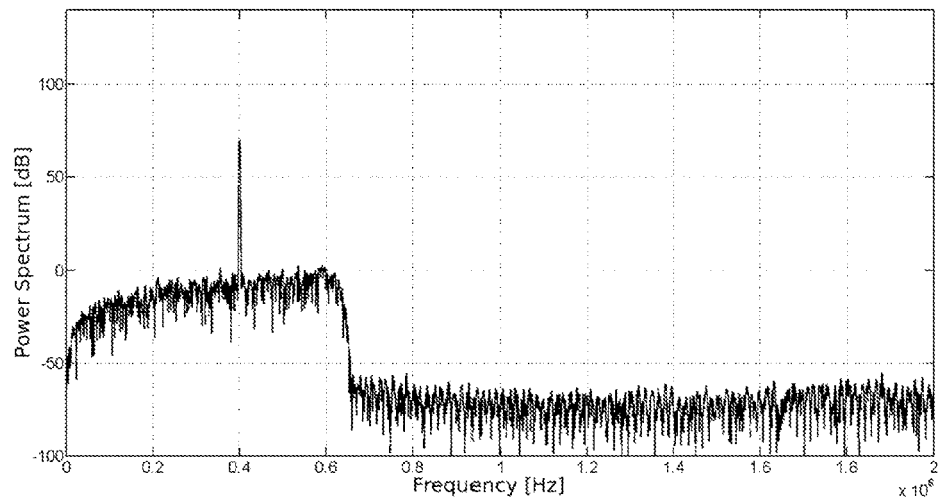
Figure 5:
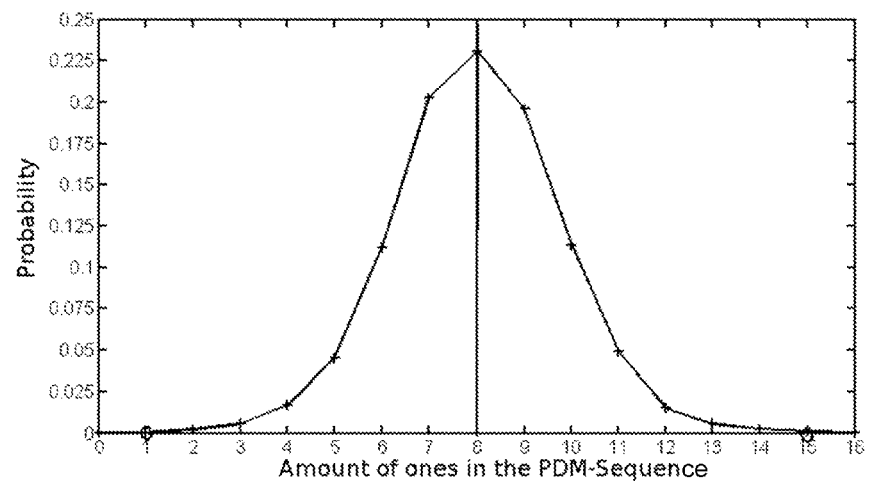
Figure 6A:
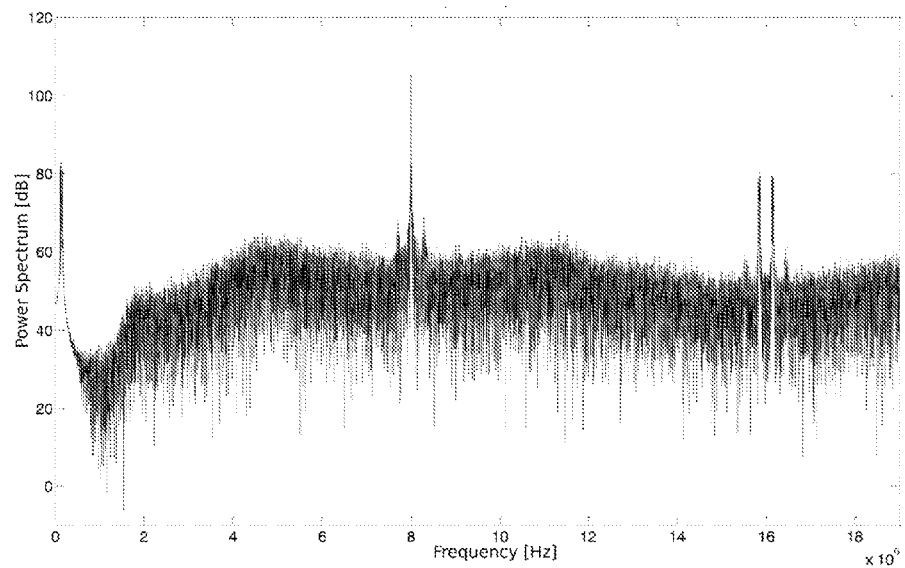
Figure 6B:
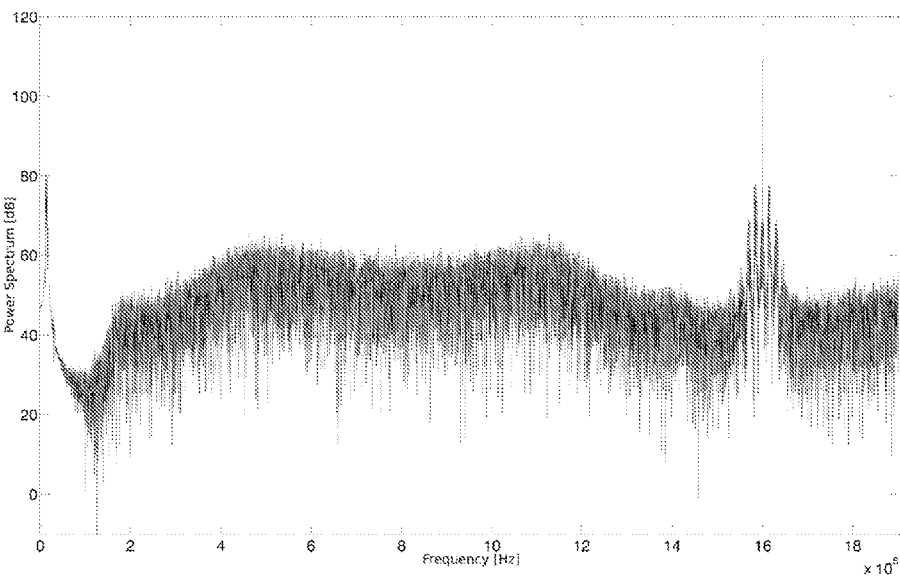
Figure 7A:
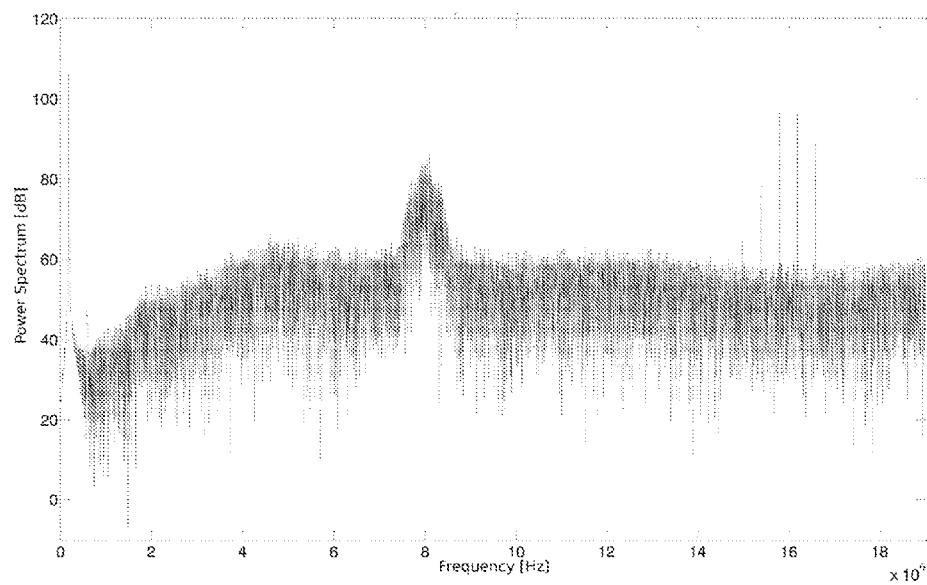
Figure 7B:
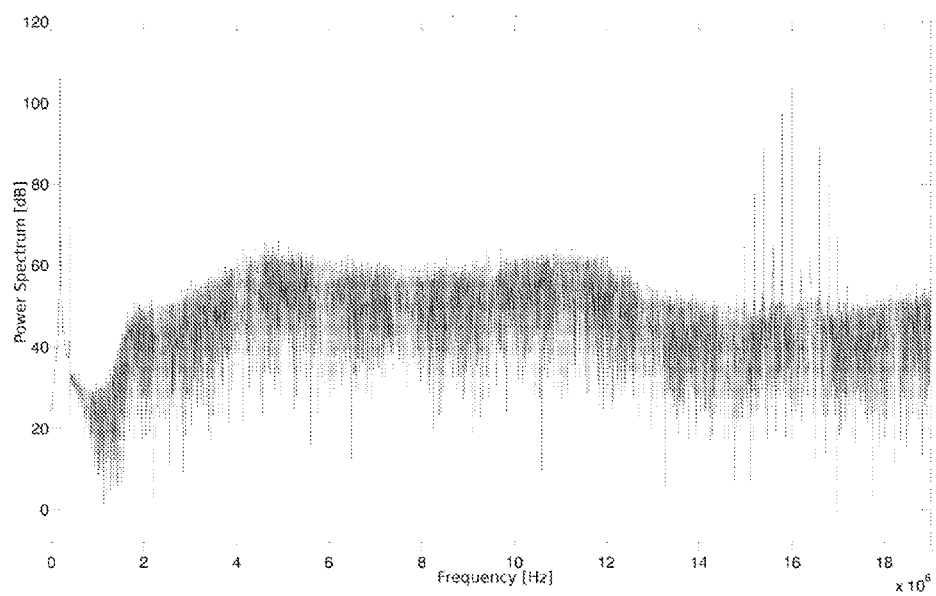
Figure 8:
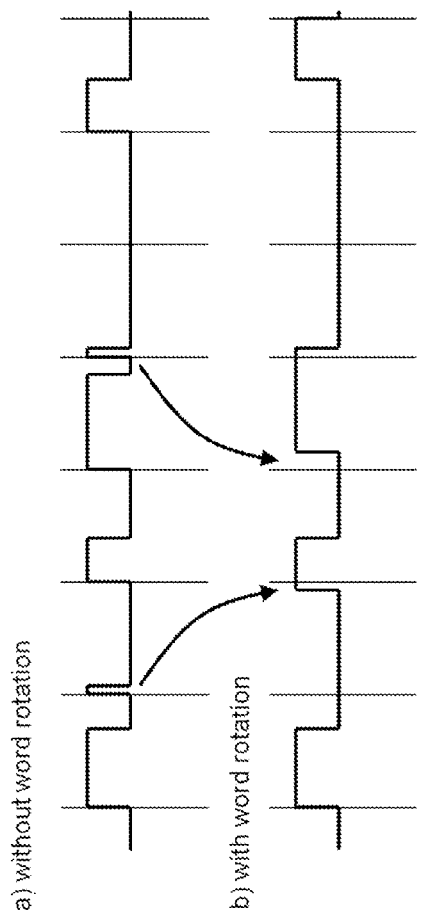
Figure 11:
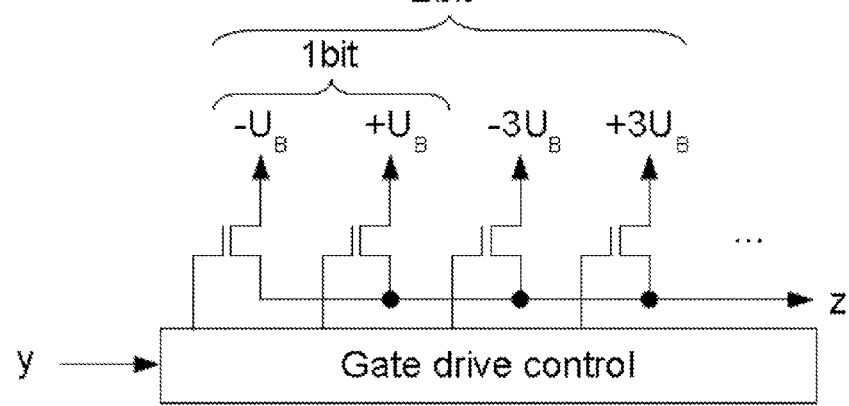
Figure 9:
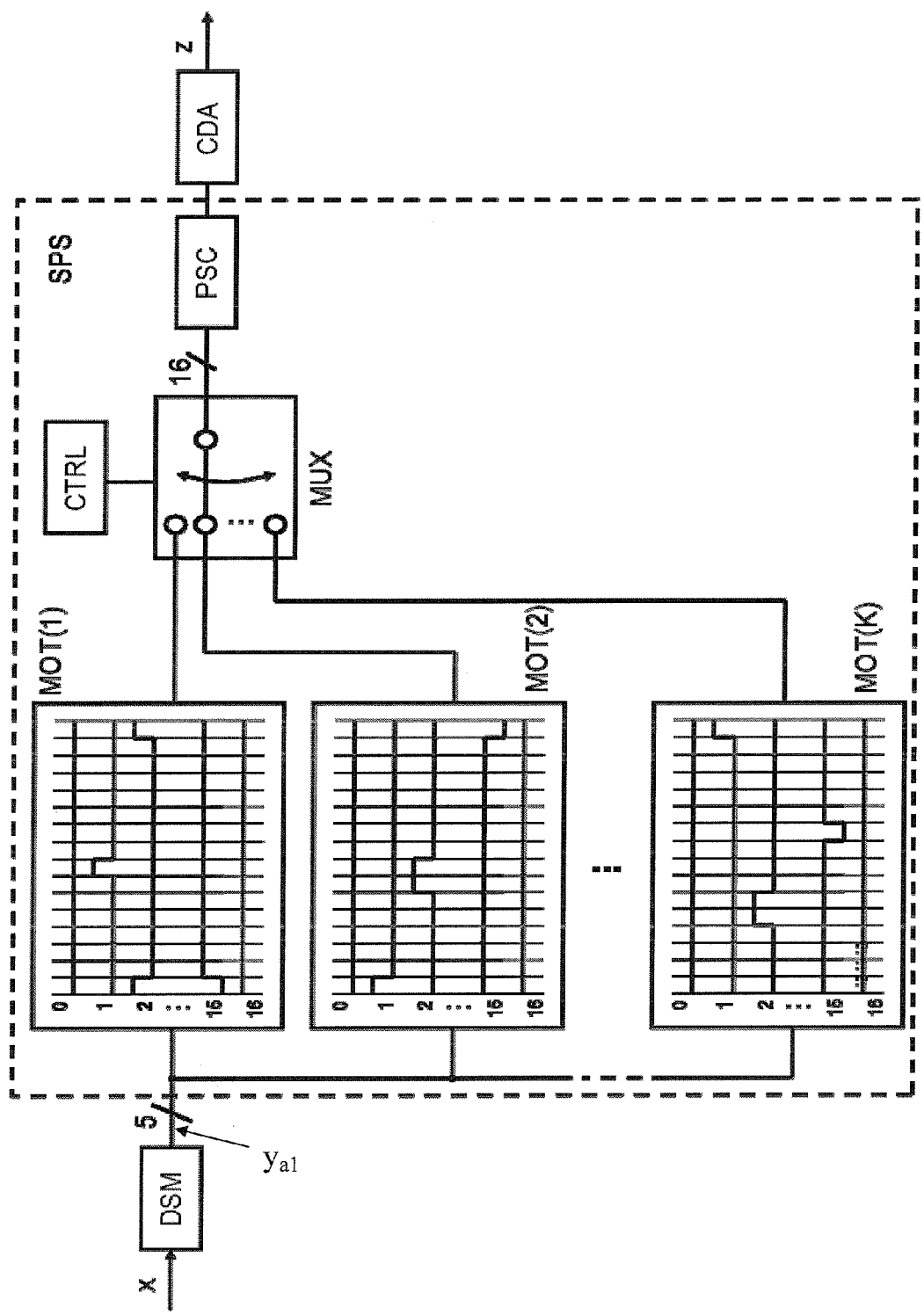
Figure 10:
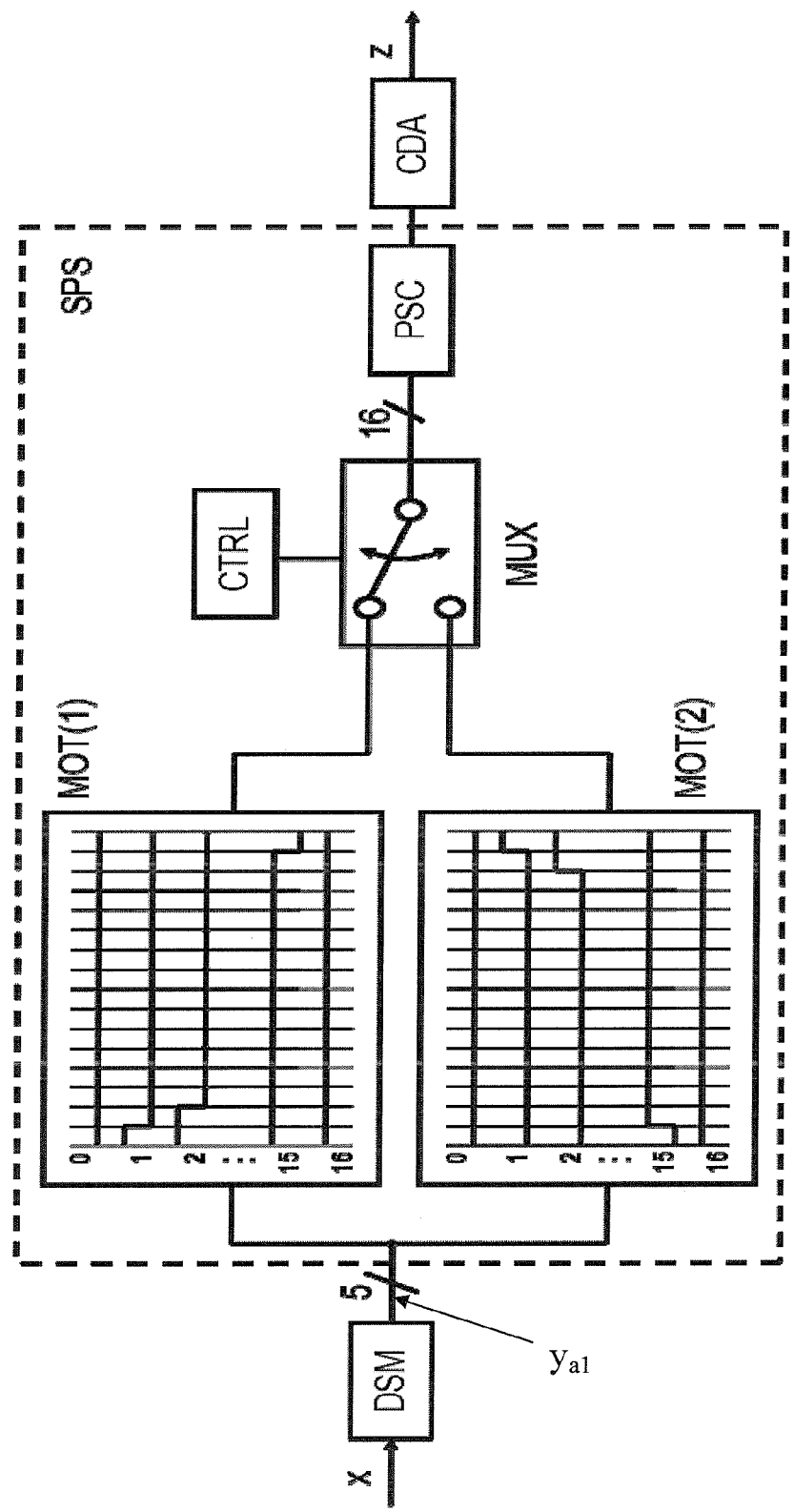
Figure 12:
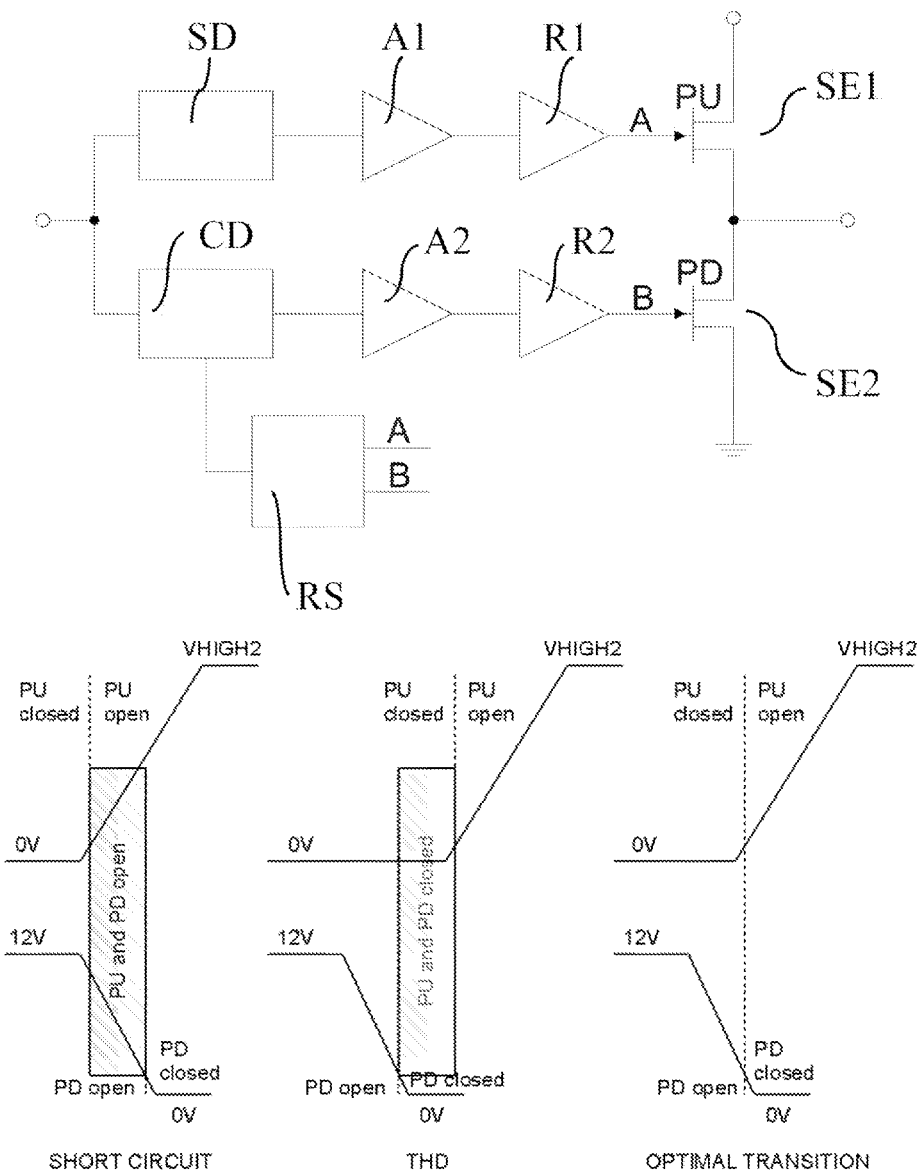
Figure 13A:
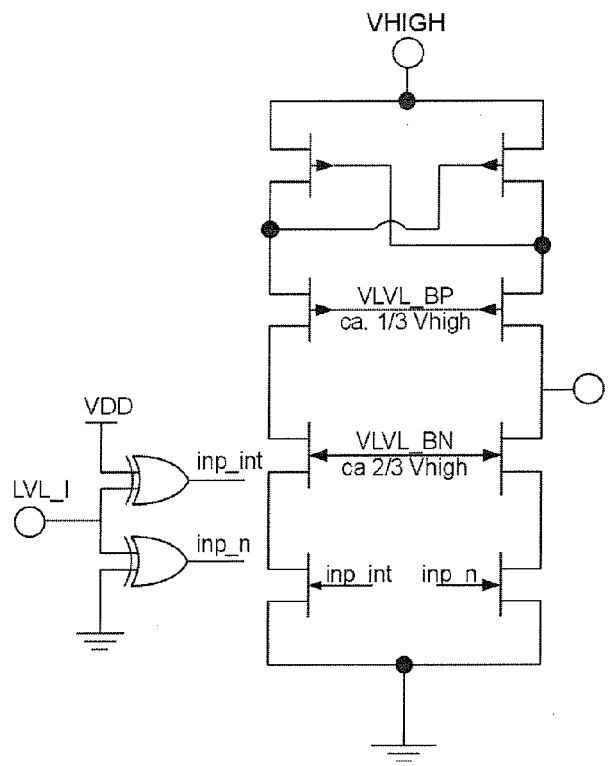
Figure 13B:
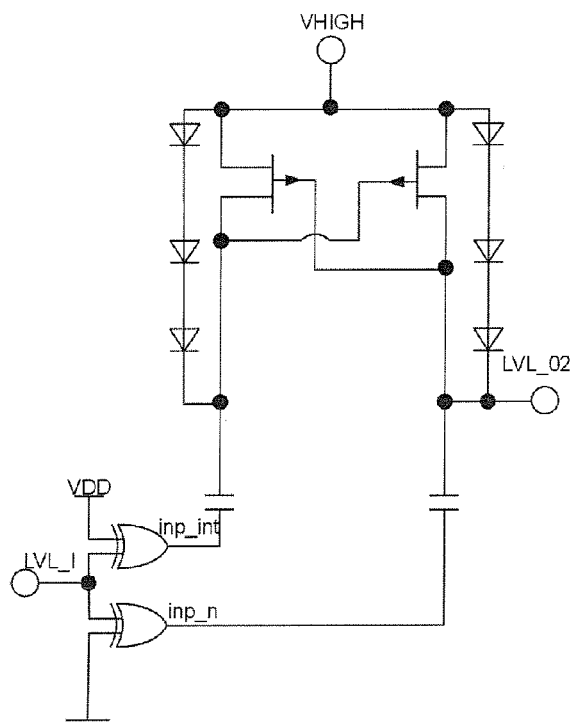
Figure 13C:
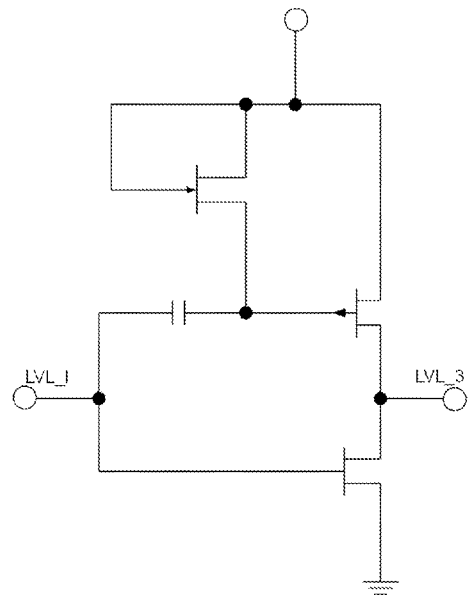
Figure 14:
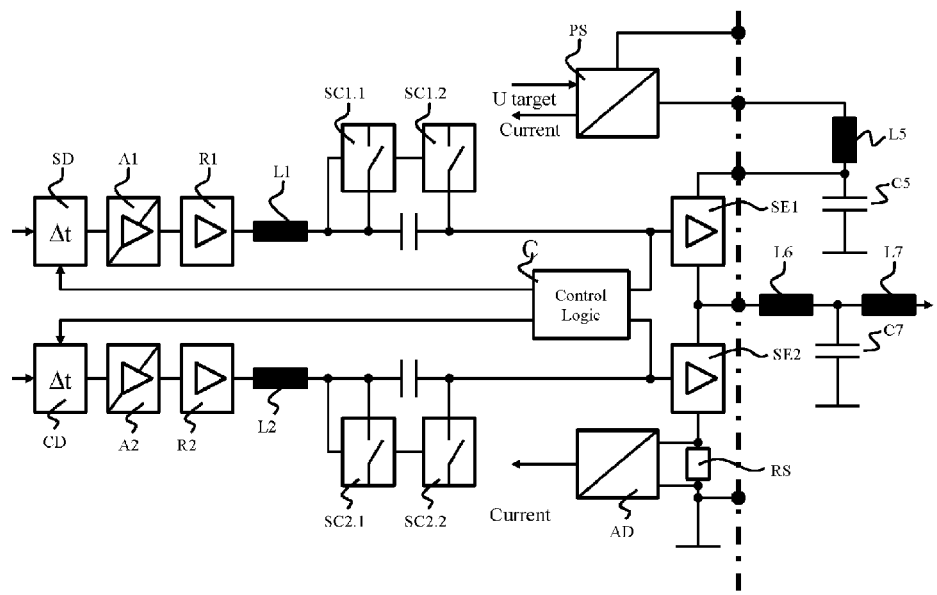

FIG. 3 shows two optimal locations for the poles and zeroes of the DSM according to FIG. 2, FIG. 4a, 4b, 4c shows the power density spectrum at the system input, quantizer output and system output as well, FIG. 5 shows the probability distribution of the number of pulses for the OFDM signal according to DSM, FIG. 6a, 6b, shows the power spectrum of the output signal of a PDM with or without word revolution for an OFDM signal, FIG. 7a, 7b shows the power spectrum of the output signal of a PDM with or without word flipping for a sinusoidal signal, FIG. 8 shows the principle of the pulse inversion using the example of a signal section according to the invention, FIG. 9 shows a further embodiment of the architecture of the device according to the invention, FIG. 10 shows an embodiment of the architecture of the inventive device according to FIG. 9 for the case of word-flipping, FIG. 11 shows an exemplary embodiment of a multi-bit switching amplifier CDA, FIG. 12 shows an embodiment for an amplifier CDA with a DDL-type control loop, FIGS. 13a, 13b, and 13b shows three embodiments of a matching pad and FIG. 14 shows an embodiment of a circuit for generating a variable supply voltage range for a switching amplifier.

DETAILED DESCRIPTION OF THE INVENTION

Figure 1A:
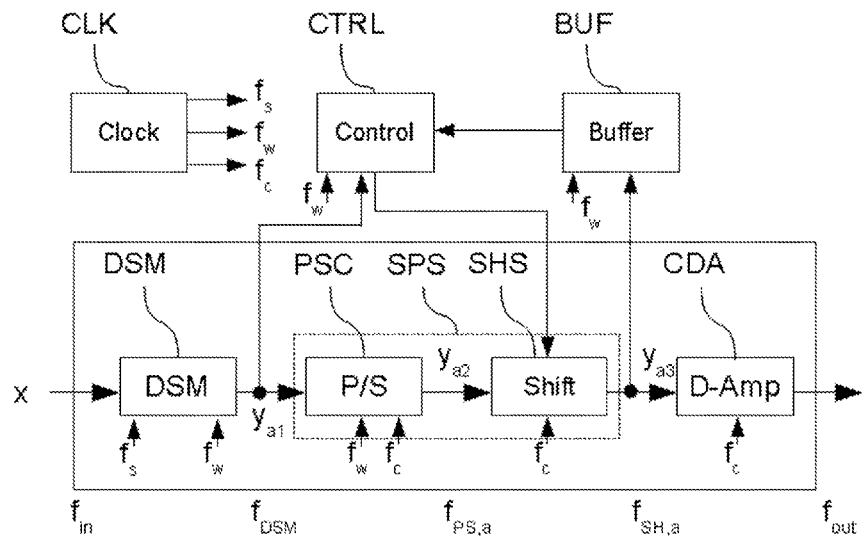
FIG. 1a, 1b shows two embodiments of the architecture of the inventive device.
Figure 1B:
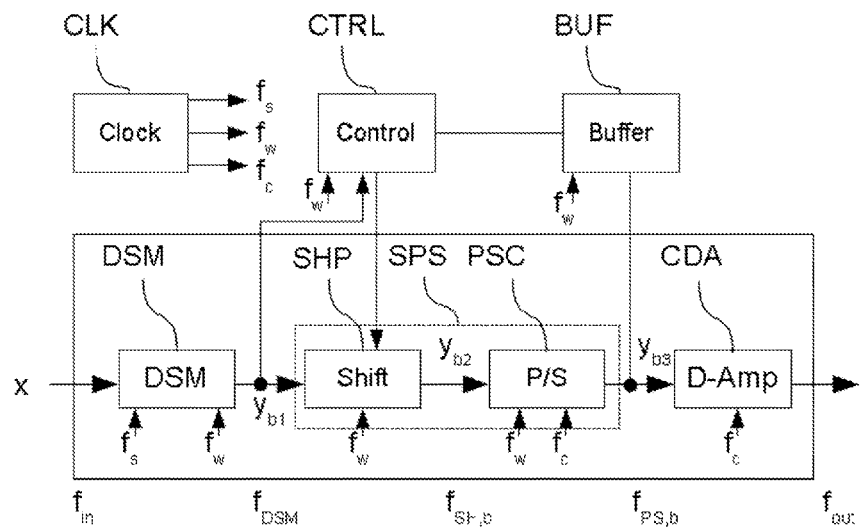

FIG. 1a, 1b shows two and FIG. 9 shows a further embodiment of the architecture of the inventive device with a delta-sigma-modulator DSM and a switching amplifier (digital amplifier) CDA connected thereto. In particular for the application PLC—systems (Power Line Communication (PLC)) these are communication systems, which distribute the information about the medium power cables including via the transmission path between a transformer station in the low voltage network and a customer equipment in the house. For this application PLC, in particular for the case of narrowband PLC in the frequency range of about 9 to 500 kHz, there are in compliance with the standards (e.g. as the European Standard (CENELEC EN 50065) or the U.S. standard FCC Part 15 Subpart B) currently available techniques, which allow bidirectional data transfer at rates of several hundred kbit/s. In EN 50065, for example, there are four frequency ranges where the maximum of permissible transmission amplitudes and the rights of use are specified. In band A in Europe the power companies uses the range of 9 . . . 95 kHz with a maximum of transmission amplitude of 10V. On the costumer side in Europe the range of 95 . . . 148.5 kHz with maximum transmission amplitude of 1,2V is available (band B to band D). In the data transmission bus coupling modules, which perform the transmitting and reception functions of the power transmission system, must account of the specific statements that are given by the 230 V power supply line as a bus. These include primarily the need for electrical isolation between the bus and application, secondly, the problem of the varying impedance of each point in the power supply network on which the bus coupling modules are connected, thirdly, the associated differences imposed on the power transmission level and the associated transmission range and fourthly, the signal reception under presence of various power disturbances in the transmission frequency band, such as e.g. surge and burst pulses and different forms of noise and the distortion of the channel as well.

In the first embodiment (see FIG. 1a) at the multi-bit output of the delta-sigma modulator DSM a parallel-serial converter PLC is connected, comprising a series connection of a parallel-to-serial converter PSC and a subsequent swap element SHS and wherein in a second embodiment (see FIG. 1b) a parallel-serial converter PLC* is connected, comprising a series connection of a swap element SHP and a subsequent parallel-to-serial converter PSC, whereby an input signal fed to the delta-sigma modulator DSM is processed with low oversampling ratio and high signal-to-noise ratio. In this case, a one-bit signal is applied at the input of the switching amplifier CDA. A one-bit switching amplifier has lower power losses in comparison to several-bit switching amplifiers. Switching elements, for example, like MOSFET, IGBT (insulated-gate bipolar transistor, bipolar transistor with insulated gate electrode) or CMOS (semiconductor devices, in which both p-channel and n-channel MOSFETs on a common substrate may be carried out).

Basis of the inventive switching amplifier CDA described below is to build a resonant circuit of the gate capacitance of the output transistor and an integrated coil. A great advantage of this structure is that energy can be saved during switching, so that the efficiency increases. However, it should be noted that in order to achieve the high efficiency of 90% as much energy has to be stored. However, this would require a large inductance, but showing a higher load resistance, and can hardly be integrated on the chip. In addition, integrated coils have large areas, which increase the chip size. It is therefore a compromise between gate driver coil and output drivers needed, which can lead to possibly several resonance levels must be established in order to meet the requirement with respect to the pulse width up to the output driver. Preferably, the switching amplifier CDA consists of two parallel branches, each with a series connection of a delay circuit SD, CD, a matching pad A1, A2 for adjusting the supply voltage of a switching element S1, S2, and a resonance driver R1, R2 for switching of the switching element S1, S2. Further in a DLL-like control loop, the switching edges at the output of the resonant driver R1, R2 are tapped and fed to a phase comparator and wherein by means of a difference a regulating circuit RS determines the delay time and the delay circuit CD is adjusted accordingly. The delay circuit SD of the embodiment illustrated in FIG. 12, has a fixed delay while the delay time of delay circuit CD is adjustable, that there is carried out a dynamic control of the signal offset. This allows in an advantageous manner to compensate temperature, aging, component variances (dispersion of the process parameters) and voltage variations. Due to the voltage control the switching behavior is changed so that a control (voltage control) in the control (tracking edge control) is achieved. The switching elements S1, S2 must be controlled to a certain precision, so that no cross currents between the switching elements S1, S2 occur and while the lowest possible dead time, where both transistors are closed, must be maintained. For this purpose, it is necessary to precisely align the edges of the control signals with each other. According to the invention this can be made by measuring and subsequent trimming. The inventive approach is based on the design of a DLL-like control loop which adjusts the flanks and pulse widths such that both criteria are best met. Furthermore, the approach is based on controllable delay elements (delay circuit CD) and a phase detector. It must be ensured, that the case, where both switching elements/transistors S1, S2 are conductive simultaneously, had to be avoided, as this operation state leads to the destruction of the components, and in that the signal forms which serve for the control of the switching amplifier CDA could be used.

The inputs fed to the switching amplifier CDA are provided by a digital IC having a 3.3V logic level (the output of the parallel-serial converter PLC). Therefore, the logic level for driving the resonant driver R1, R2 must be implemented.

Through the specification can be obtained considerable demands on the matching pad A1, A2:
Low power consumption and
Rapidly moving from 3.3V to voltages <40V All of the solutions shown in the following in FIGS. 12a, b and c have a similar behavior, both in timing and in power consumption. Differences arise, however, in complexity. Due to the principle there is the problem of the edge-regeneration when the power is >24V. In this case, again must be considered the restriction by $U_{GS(MAX)}$. For controlling the pull-down transistors merely 12V-transistors are needed, which benefit the space consumption and the speed of to.

Generally, the matching pad A1, A2 is only required if the supply voltage exceeds a certain level. In particular in the case of minimum power supply of 2 V to the conversion can be dispensed. In this case for providing a proper controlling a communication between the power supply and the signal path must be provided. Depending on the selected supply voltage the perfect signal path can be selected for control.

According to the inventive concept it is possible, that minimum pulse width of 3.9 ns can still be through-connected. The efficiency, which was determined by measuring the performance of individual transistors, is between 91% and 93%. For the final stage, transistors, which are constructed from 40V variants are selected, resulting in savings of space about 30-40% and the requirements for the control can be designed effectively.

In both cases of the type of power stage additional supply voltages are required. The NN-concept requires a boosted supply for the pull-up, one at 12V underlying voltage for the gate driver and a 12V voltage for the pull-down. The PN-approach requires also the 12V and the supply can be reduced by 12V. Which is used depends on the dimensions of the output stage and the thereby resulting efficiency.

As in FIG. 11 illustrated an exemplary embodiment of a several bit-MOSFET-power amplifier CDA according to the number bits (here: M–CDA=2) $2^{M-CDA}=22=4$ potentials across the MOSFET-switches are fed to the output z. According to the respective input signal y (corresponding to $y_{a3}$ and $y_{b3}$ in FIG. 1a/b) a control (control CTRL) switches the respective potential at the chip clock $f_c$ to the output z.

Furthermore, an oversampling with a specific oversampling (OSR) takes place in the DSM or at the input of the DSM. In general, the achievable signal-to-noise ratio (SNR) increases with increasing oversampling (OSR). To achieve the highest possible SNR, a very high oversampling factor (OSR) would thus be desired. On the other hand, however, useful oversampling factors (OSR) are limited in terms of the resulting frequency shift at the input of the switching amplifier and the realization problems associated therewith.

After the scan, the filtering of the signal (loop filter) takes place in a loop filter. In principle, the loop filter includes a signal transfer filter for the input signal of the DSM, and a noise transfer filter for the feedback signal from the output of the quantizer Q of the delta-sigma modulator DSM. Conventional filters here have the problem that they in the field of eligible oversampling factors (OSR) do not achieve the needed or the desired signal-to-noise ratio (SNR). Therefore, not a conventional filter here comes to use but a filter based on reduced sampling rate, a so-called RSR filter (RSR: Reduced sampling rate). Conventional filters and their use are, for example, described in the reference book "Understanding Delta-Sigma Data Converters" by Richard Schreier and Gabor Temes, Wiley Interscience Publication 2005, ISBN 0-471-46585-2 page 91 if; RSR-filters are known for example from the article "Low-voltage Sigma-Delta Modulator Topologies For Broadband Applications" by Mohammed Yavari and Omid Shoaei published in IEEE International Symposium on Circuits and Systems, ISCAS 2004, pages 465-468.

For the application in consideration suitable filters are RSR filters, which are optimized to the respective system parameters (signal bandwidth, sampling rate, oversampling factor (OSR)).

When using RSR filters, the signal-to-noise ratios (SNR) are significantly higher in the range of eligible oversampling factors (OSR) compared with conventional filters. The realization of the inventive solution shows that the use of RSR filters leads to a significantly (for example, by a factor of 3) lower switching frequency at the output of the parallel-to-serial converter PSC.

To enable a flexible adaptation to various system parameters the DSM is preferably reconfigurable (e.g. transmission parameters such as the frequency band); for this purpose, the coefficients are written in a special register (in the drawing, not to be shown). Examples of the system parameters stored in the register are:
Sampling rate $f_s$
Word rate $f_w$
Chip rate $f_c$
Parameters a1, a2, b1, b2 of the loop filter (especially RSR filter).

In the context of the invention viewed, the power amplifier is power electronics, for example, of C-MOS-transistors, which due to their (technology-inherent) relatively long switching flanks have a strong restriction to the clock frequencies used. These have the effect that—above a certain frequency—pulses of very short duration are no longer detected and thus error in the signal processing results, which lead to a deterioration of the SNR at the output.

As at the output of the DSM a multi-bit signal is present, according to the invention, the CDA expects a one-bit signal, thus a signal conversion between the respective functional blocks is required. This signal conversion takes place in a parallel-serial converter PLC or PLC* such that, at the most favorable conditions for realizing the highest possible SNR occurs at the output of the switching amplifier CDA.

The realization of this parallel-to-serial converter PLC or PLC* according to the invention, can—as already mentioned above—carried out by the P/S block PSC and the subsequent swap element SHS (see FIG. 1a) or, alternatively, in accordance with FIG. 1b by the swap element SHP and the subsequent P/S block PSC. The following description refers to the embodiment according to FIG. 1a.

The P/S block PSC is connected with the delta-sigma modulator DSM and converts the multi-bit output $y_{a1}$ of the quantizer Q of the DSM with the sampling frequency $F_{DSM}$ with M bits into a one-bit PDM-like signal $y_{a2}$ (PWM pulse width modulation) with the sampling frequency $f_{ps,a}$. At this time, depending on the respectively applied multi-bit value of the input signal $y_{a1}$, at a constant frequency the duty cycle (width) of the output signal $y_{a2}$ is modulated. That is, each M-bit value is converted into a word of $N_{PS}$ successive binary values which represent according to the invention the M-bit value similar to a PWM value. This means that in each word of the output signal $y_{a2}$ a maximum of one alternation between binary ones and zeroes or zeroes and ones occurs.

In the mapping between multi-bit values of the input signal $y_{a1}$ and the output signal $y_{a2}$ a key element is that it is linear. From this parallel-serial conversion thus results in a signal that contains at most one transition between binary values (ones and zeroes, or vice versa) respectively at the word boundaries and/or one transition between the binary values all are within a word.

The required clock multiplication at P/S conversion is done by a factor equal to the word length $N_{PS}$ (word length of the PDM-like signal at the output of the P/S converter PSC). The word length $N_{PS}$ and thus also the factor for clock multiplication are selected dependent on the used values range from $y_{a1}$ or dependent on the possible number $N_{DSM}$ (number of possible, adopted by $y_{a1}$ values at the output of the DSM; corresponds to the oversampling factor (OSR)) adopted by $y_{a1}$ values. The selection of word length $N_{PS}$ is taken into account that on the one hand all $N_{DSM}$ possible values of $y_{a1}$ can be represented in the above manner clearly reversible on a word of the output signal $y_{a2}$ and on the other hand, with regard to the implementation results, the lowest possible factor for clock multiplication $N_{PS}$ results.

Preferably, taking into account these two criteria $$N_{PS} = N_{DSM} - 1$$

is selected.

To reduce the switching frequency, now according to the invention in a further step, namely in block SHS, an adaptive, memory-affected inverting of the pulses is made while the input signal $y_{a2}$ is word wise transferred to the output signal $y_{a3}$. Depending on the last bit value (0 or 1) of each preceding word in the resulting output signal $y_{a3}$ the current pulse is possibly reversed or transferred unchanged to the output signal $y_{a3}$, so that the number of pulse edges (i.e. change of bit value from 0 to 1 or vice versa) is minimized. The first word is preferably adopted without change, in the context of the invention, however, the swapping can be carried out here. The clock controller provides (see FIG. 1a) the clocks $f_s$ (sampling), $f_w$ (word clock) and $f_c$ (chip-/bit clock), of which only the required are supplied to the individual function blocks. Thus, with the word clock the each last bit of previous word of the output signal $y_{a3}$ is latched in the buffer BUF. The controller CTRL in turn controls the shift in the block SHS depending on the bit value in the buffer BUF and the current word at the output of the DSM, in particular the first bit.

Under the swapping of the pulse is understood that the sequence of binary ones and zeroes of this pulse (if any) will be reversed. That is, one word (pulse) starting with k binary ones followed by ($N_{PS-k}$) binary zeroes in the case of inverting will be a word (pulse) starting with ($N_{PS-k}$) binary zeroes followed by k binary ones. The number of zeroes and ones of a pulse thus remains unchanged by swapping, only their order changes.

Through this inventive method of parallel-serial conversion with adaptive, memory lossy inverting the pulses thus eliminates the pulse edges on word boundaries, while the pulse edges within the word boundaries continue to exist—although moved if necessary—so that ultimately the number of pulse edges at the input of the switching amplifier CDA (digital amplifier) is reduced significantly by flipping (more precisely, almost halved). This reduction results in the same measure for the switching frequency of the semiconductor elements in the output stage, and for the present signals at the chip pads.

The effect of this inversion to the waveform can be neglected and no relevant/appreciable distortion of the signal results. On the other hand, due to the achieved halving of the switching frequency at the same technology this allows a higher sampling rate at the input of the DSM and a higher oversampling factor (OSR), whereby a higher SNR can be achieved at the output.

Another advantage of this inversion is that in conventional pulse width modulator PWM, the carrier frequency is present as a prominent signal component in the output signal, since the rising edge within a word (or more precisely at the word boundaries) is always at the same position (this means at the same distance). According to the inventive method, however, there are no more edges at fixed locations of the PWM signal. Therefore at the carrier frequency no longer a significant portion occurs, but this is divided to a plurality of frequencies (the carrier frequency) ("smearing"). This allows a simplified limit compliance with the spectrum measurements of transmitting for meeting standards.

By the following embodiment the method according to the invention will be further described and explained. It is a useful signal to be amplified within a frequency range of about 10 kHz to 500 kHz, which can assume bandwidth of 10 kHz to 400 kHz. The signal at the input is to be amplified at a sampling rate of approximately 2 MSps at a resolution of 12 bits. The input signal is an OFDM signal in the case considered, having a dynamic range of approximately 87% of the 12-bit resolution. By means of the device according to the invention using a low oversampling factor (OSR) of 8, a total SNR can be achieved by more than 60 dB. The targeted switching frequency for the output of the DSM (i.e. at the input of the switching amplifier) is about 8 MHz. It is to distinguish between two frequencies, namely the carrier frequency and the highest harmonic. The carrier frequency is calculated as follows:

Sampling frequency of the input signal·Oversampling factor of the DSM/2

The factor ½ results of the word flipping so that in the embodiment, the carrier frequency is: 2 MHz·8/2=8 MHz.

As DSM an architecture $4^{th}$ order, as shown in FIG. 2, is used, which per se is known from the article "A reduced-sample-rate sigma-delta pipeline ADC Architecture for High-Speed High-Resolution Applications" by Vahid Majidzadeh and Omid Shoaei in IEICE Transactions 89-C (6): 692-701 (2006).

A special loop filter from the class of RSR filter (Reduced-Sampling-Rate-Filter), with a NTF filter higher order, ensures higher SNR-values at low oversampling rates (OSR).

The transfer function H (z) is as follows:

$$H(z) = \frac{b_1 z^{-1} + b_2 z^{-2}}{1 - a_1 z^{-1} - a_2 z^{-2}}$$

The quantizer is different here $N_{DSM}=17$ stages at the input and converts them respectively into a 5-bit value (i.e. M=5). Any 5-bit value at the input of the parallel-to-serial converter PSC is converted by the latter into a binary word of length $N_{PS}=N_{DSM}-1=16$. For the subsequent representation can be assumed for simplicity that the 5-bit values of the signal $y_{a1}$ are available in the range [0; 16]. The P/S-conversion of the value $y_{a1}$ [n] can then for example be done by $y_{a1}$ [n] binary ones and ($N_{PS}-y_{a1}$ [n]) subsequent zeroes. This is illustrated in the following example of the values $y_{a1}$ [n] of 9, 4 and 10, which are referenced for simplicity as $y_{a1}$ [I], $y_{a1}$ [2] and $y_{a1}$ [3]. The value $y_{a1}$ [I]=9, for example, is shown in $y_{a2}$ by 9 a binary ones and 7 (=16-9) binary zeroes.

For better readability the word boundaries are in this case illustrates by '|' as well the signal edges illustrated by the '1' scored above and the '0' underlined.

The formation of the signal $y_{a3}$ is done according to the invention as follows: because the first value $y_{a1}$ [I] has no previous value, the corresponding bit sequence is unchanged from $y_{a2}$ to $y_{a3}$. For the value $y_{a1}$ [I] the associated sequence of $y_{a3}$ ends to '0'. As the to $y_{a1}$ [2] corresponding sequence in $y_{a2}$ begins with '1', this sequence will now according to the invention be taken reversely in $y_{a3}$—so starting with their binary zeroes. The associated sequence of $y_{a3}$ ends for the value $y_{a1}$ [2] thus to '1'. As the sequence in $y_{a2}$ corresponding to $y_{a1}$ [3] also starts with '1' this sequence is copied to $y_{a3}$. In comparison to the signal $y_{a2}$ thus the pulse edges (1-0- or 0-1-transitions) in $y_{a3}$ are omitted on word boundaries between $y_{a1}$ [I] and $y_{a1}$ [2] as well as between $y_{a1}$ [2] and $y_{a1}$ [3].

|       | $Y_{a1}$[1] | $Y_{a1}$[2] | $Y_{a1}$[3] |
|-------|-------------|-------------|-------------|
| $Y_{a1}$: | \|<    9    >\| | \|<    4    >\| | \|<    10    >\| |
| $Y_{a2}$: | \|1111111110000000\|1111000000000000\|1111111111000000\| ... | | |
| $Y_{a3}$: | \|1111111110000000\|0000000000001111\|1111111111000000\| ... | | |

Following advantages are achieved by the inventive word-flipping:
1—The carrier frequency that is generated by PDM pulses beginning at fixed locations is smeared (see the power spectrum of the output signal of the Pulse duration modulator PDM with/without word—flipping in comparison of FIGS. 6a and 6b).
2—Switching frequencies to output pulses are halved→reduced power losses.
3—Short pulses (or Notches ("notches")) are significantly lower.

Compared to conventional NTF-Filter, in the inventive filter the poles and zeroes are placed differently, which results in a better stability results. FIG. 3 shows two optimal locations for the poles and zeroes pursuant to the foregoing essay, "A reduced-sample-rate sigma-delta pipeline ADC Architecture for High-Speed High-Resolution Applications" by Vahid Majidzadeh and Omid Shoaei a.a.O. for architecture of $4^{th}$ order according to FIG. 2

FIG. 4 shows an example for the power density spectrum of the multi-bit-DSM-signal at three points of the inventive device, namely at the system input, the quantizer output and the system output. For the sake of greater comparability a sinus was used here.

Furthermore, there was used a reduced-sampling-rate-filter $4^{th}$ order and for the DSM an oversampling ratio of eight was used so that, when the applied input signal have a sampling rate of 2 MSps, at the output of the DSM a signal having a clock rate of 16 MSps was present. The quantizer at the output of the DSM generated a sequence of 5-bit values by differentiation of 17 states.

From this example it is clear that despite the low oversampling factor used (OSR) of 8 at the system output the desired SNR is achieved by more than 60 dB. This clear advantage of the inventive method/apparatus is seen in comparison with conventional systems, which would be impossible to achieve it.

FIG. 5 shows a probability distribution of the number of pulses within the PDM-representation for an example of a real OFDM-signal sequence (carrier frequency fc=150 kHz, bandwidth B=50 kHz) after processing by the RSR delta-sigma modulator and the subsequent inventive parallel-serial implementation PLC. It can therefore be seen that the critical pulses (pulses of a one out of a total of 16 slots, or 15 ones of a total of 16 slots in the PWM sequence corresponding to a very short (positive) pulse or a very short break-in) occurs in the OFDM signal with very low probability. Without the invention this probability is significantly higher (not shown in FIG. 5) and thus the likelihood of a deterioration signal.

At the same time would result in the conventional case (i.e. without reduced sampling rate) a higher switching frequency at the input of the switching amplifier CDA. Due to the already mentioned low-pass characteristic of the chip pads would thereby also the problems with the reliable detection of short switching edges is exacerbated. This is the case, since with increasing frequency the region—in relation to the width of the switching edges—of higher sampling rate increases in which pulses cannot be detected reliably. If due to the used chip technology at a clock frequency of 128 MHz on the switching amplifier CDA only pulses of a width of 1 sample clock no longer reliably detected, this is valid at higher frequency (from approximately 256 MHz) also for pulses of a width of two sampling periods. This distortion of the output signal is also conceivable if one considers the characteristics of the chip pads. With regard to short pulses (or short notches) these typical delays at rising edges (falling edges) leads to distortions of the output signal.

The use of lower clock frequencies, as possible by the inventive method, is reflected by the resulting reduction of signal distortions in addition a positive impact on the SNR. It is clear that the use of a low OSR plays a great importance.

FIG. 6a shows the power spectrum of the output signal of a PDM with or FIG. 6b without word flipping using the example of an OFDM signal with a carrier frequency (or also: Center frequency) of 150 kHz and a useful bandwidth of 50 kHz. Here were used an oversampling ratio (OSR) of 8 and a word length of 16 at the output of the P/S-converter.

Illustrated in FIG. 6b is clear to see the PDM carrier frequency (16 MHz) as a prominent peak and additional shares at this carrier frequency. The PDM carrier frequency projects beyond the actual signal frequencies by about 30 dB. The noise components to the OFDM signal are shifted by the DSM in the frequency range up so that in the frequency range of interest there is available an SNR of about 50 dB.

Illustrated in FIG. 6a it can be seen that—by the special P/S-conversion and the generated halving of the switching clock—the proportion in the PWM carrier frequency for the most part (8 MHz) has been shifted to half the carrier frequency. The same is true around for some much lower proportions around the carrier frequency. In a subsequent reconstruction low-pass (in this example, with cutoff frequency 700 kHz) these signal components are filtered. Also arise in relation to the case illustrated in FIG. 6b the benefits that on the one hand the striking proportion which derives from the carrier frequency (in FIG. 6b at 16 MHz; shown in FIG. 6a shifted to 8 MHz) is lower by several dB already, and on the other hand, the shares at the lower frequency of 8 MHz are more favorable with respect to radiation.

FIG. 7a, 7b shows substantially the same result as FIG. 6a, 6b, however, for the example of a sinusoidal signal at 200 kHz. It is possible to see here in the comparison of the two FIG. 7a and FIG. 7b that by the inventive method, the outstanding peak at the carrier frequency is moved to a broader range around the halve carrier frequency and was "smeared". In addition, the disturbing content of twice Sinusoidal signal frequency was on the one hand smeared on the surrounding frequency range, a remaining prominent share has also shifted in frequency upwards and was significantly attenuated (by more than 20 dB).

The following significant advantages of the inventive method are thus clear from the FIG. 7A, 7B and FIG. 6a, 6b:

The shares in the high frequency range can be significantly reduced, which significantly have positive effect in operation of the transistors.
Interference components in the surrounding area of the signal frequencies are significantly reduced.

FIG. 8 shows the principle of the inventive, adaptive, memory lossy flipping of the pulses for the example of a signal section at the output of the specific P/S converter. FIG. 8*a* shows the sequence of pulses before (or without) flipping and FIG. 8*b* after flipping. From this, effected by the flipping the significant reduction of the number of the signal edges can be seen.

The operation of the embodiment of the signal conversion by means of a swap element SHP and a subsequent parallel-to-serial converter PSC between Delta-Sigma Modulator DSM and the switching amplifiers CDA connected thereto according to FIG. 1*b* is similar, so that further explanation is therefore omitted. Here, the parallel output signal $y_{b1}$ of the quantizer Q is in the swap element SHP processed by an adaptive, memory-lossy inverting of the pulses so that the sequence of binary ones and zeroes of this pulse (if any) swapped while the input signal $y_{b1}$ is placed word by word in the output signal $y_{b2}$. Subsequently, the parallel-to-serial converter PSC connected to the swap element SHP converts the multi-bit output signal $y_{b2}$ of the swap element SHP with the sampling frequency $f_{DSM}$ at M bits in a PDM-like one-bit signal $y_{b3}$ with the sampling frequency $f_{PS,b}$, whereas at a constant frequency and in dependence of the respective adjacent multi-bit value of the input signal $y_{b2}$, the duty cycle of the output signal $y_{b3}$ is modulated such that in each word of the output signal $y_{b3}$ a maximum of one alternation between binary ones and zeroes or zeroes and ones occurs.

FIG. 9 shows a further embodiment of the architecture of the inventive device. The parallel-serial converter SPS consists of K parallel-connected modulation tables MOT(k) with a subsequent multiplexer MUX and a subsequent parallel-serial converter PSC. In the modulation tables MOT(k) of each multi-bit input value is mapped (from DSM) to a (usually) different arrangement of binary ones and zeroes, that is, each M-bit value is mapped in a word of $N_{PS}$ subsequent binary values. The downstream MUX provides a means for selection, which depending on a control CTRL sends for each clock of an input value in each case a word of a modulation table MOT(k), that is the word formed there, to the output. In the subsequent parallel-serial converter PSC then a conversion of the binary words in serial binary values follows.

In the example of FIG. 9 each 5-bit value at the output of the DSM is converted in each of the K downstream modulation tables MOT(k) a binary word of length $N_{PS}=N_{DSM}-1=16$. For the subsequent representation can be again assumed for simplicity that the 5-bit values of the signal $y_{a1}$ are available in the range [0; 16].

The conversion of the value $y_{a1}$ [n] in a modulation table MOT(k) takes place preferably by $y_{a1}$ [n] binary ones and $(N_{PS}-y_{a1}$ [n]) zeroes, where depending on the modulation table MOT (k) a different mapping on or array of binary ones and zeroes results. In contrast to the well described special case of the word flipping the arrangement of these binary ones and zeroes in principle is arbitrary, i.e. they must not necessarily be contiguous. Characterized while on the one hand the demand for minimizing the number of switching edges is abandoned, on the other hand improved spectral properties can be achieved by suitable selection of modulation tables MOT(k), and their control by the multiplexer MUX, however.

The control/control element CTRL carries out the control of the multiplexer MUX and thus the selection which output of which modulation table MOT(k) is in each case connected to the parallel-serial converter PSC, and thus which mapping of the M-bit value at the output of the DSM on a binary word to be respectively connected to the input of the PSC. This control by a control/control element CTRL can be both memories fraught, systematically or randomly. In the implementation of a random control a random number is generated for each word, and thus the selection of the applicable modulation table for each said word and the decision as to whether a flipping is carried out. The benefit is that by the random selection of the method of flipping of a DSM-output value in a specific sequence of bits, a spectral distribution of noise components from the switching of the amplifier D is achieved, for example for each word a random selection select of one of the modulation tables, in particular, discrete spurious lines with high disturbance amplitude are converted into wide-band noise components of small spectral power density. The number K of modulation tables MOT(k) used, the contents (Figure patterns) and the type of control of the multiplexer through the control/control element CTRL are chosen depending on the properties to be obtained of the output signal and the opportunities in the implementation of the switching amplifier CDA. Thus for example in the respective embodiment of the invention could be included, whether the reduction of the number of switching edges applied to the subsequent CDA or the spectral characteristics of the output signal of the CDA are more important for the particular application and implementation.

FIG. 10 shows a special case of the more general case described in FIG. 9. The upper modulation table MOD(1) forms the 5-bit value at the input respectively at a one-bit PDM signal, on the other hand the lower modulation table MOD(2) takes a flipping relative to the MOD(1), i.e., here against MOD(1) the mapped words each are flipped. It is clear that this special case of using a memory lossy control of the multiplexer MUX corresponds to the already described method of the adaptive, memory lossy inverting of the pulses. FIG. 10 thus corresponds to a different representation of FIG. 1*b*.

The embodiments of the invention described previously with a series connection of a parallel-to-serial converter and a swapping member (SHS or SHP) thus represent special cases of the inventive device.

The invention is not limited to the described method or function blocks, but also includes different methods that are similar to the present caused substantial effect. In the context of the invention instead of P/S-conversion and memory lossy flipping, as shown in FIG. 1*a* and FIG. 1*b*, a P/S-conversion with direct memory-lossy mapping of values could be made. For this purpose the generation of the output pulse can, for example, takes place by a counter (not shown in the drawing). This is reset at the beginning of each word. Upon reaching a predetermined count each output is switched.

In a specific embodiment, this is implemented as follows:

In the normal sequence (i.e., without word flipping), at the beginning of each word the output is switched and when the counter reaches a count according to the value of the DSM-output (i.e. $y_{a1}$ or $y_{a2}$ according to FIG. 1*a* respectively FIG. 1*b*), the output is turned off.

In the inverted order (i.e. with word flipping), the output is switched off at the beginning of each word and reaching the count of $[N_{PS}-DSM\text{-out}]$ (i.e. $[N_{PS}-y_{a1}]$ in accordance with FIG. 1*a* or $[N_{PS}-y_{a2}]$ according to FIG. 1*b*), the output is switched on ($N_{PS}$=ratio of word/bit rate). The selection of the operating mode (with/without word flipping) occurs at the beginning of each word based on the last bit of the previous word.

The inventive devices allow a significant increase in energy efficiency, reduction in power consumption and a variable supply voltage range and thus an adaptation of the dynamics with optimal SNR at variable net supply impedance and thus adapted variable transmission power. The adaptation of the supply voltage and the transmission power associated with it, allows to avoid the overload of the amplifier CDA, and the clipping of the wanted signal and the distortion due to saturation effects (inductors, residual difference from the supply voltage, override corresponds to nonlinearities or lack of sensitivity and reduction in range). The determination of the transmit power and output power of the switching amplifier CDA, as FIG. 14 shows, can be determined by measuring the current using a shunt RS at the switching element SE1, SE2 for known Ri, or in Power Supply for the CDA, or via the receiver channel RXD of the communication system during active transmission. This match delay circuit SD, CD and matching pad A1, A2 the of FIG. 12 and in FIG. 14 R1 and R2 are driver coils in the output of the final boost-capacitor (SC1.1, SC1.2, SC2.1, SC2.2) power amplifier, which at the same time works as resonance driver for generation of edges.

Furthermore, the invention is also not yet limited to the combination of features defined in the claims, but can also be defined by any other combination of specific features of all the individual features disclosed overall. This means that every single feature of the claims is omitted or be replaced by at least one elsewhere in the application of individual feature is disclosed.

The invention claimed is:

1. An apparatus comprising:
a delta-sigma modulator;
a parallel-serial converter connected to the delta-sigma modulator; and
a switching amplifier connected to the parallel-serial converter;
wherein the parallel-serial converter comprises, in series, a parallel-to-serial converter and a subsequent swap element,
wherein a multi-bit output $y_{a1}$ of the delta-sigma modulator is an input signal for the parallel-to-serial converter;
wherein a serial output signal $y_{a2}$ of the parallel-to-serial converter is an input signal for the swap element,
wherein the swap element generates an output signal $y_{b3}$,
wherein the swap element, based on a last bit value 0 or 1 of a preceding word in the output signal $y_{a3}$, reverses a sequence of binary zeroes and ones of a current word, where present, and
wherein the delta-sigma modulator is configured to perform the functions of receiving an input signal having a frequency range above 25 kHz, oversampling the input signal at an oversampling ratio that lies between 7 and 15, and maintaining a high signal-to-noise ratio such that 1-0 and 0-1 transitions at word boundaries are substantially eliminated.

2. An apparatus comprising:
a delta-sigma modulator;
a parallel-serial converter connected to the delta-sigma modulator; and
a switching amplifier connected to the parallel-serial converter;
wherein the parallel-serial converter comprises, in series, a swap element and a subsequent parallel-to-serial converter,
wherein a multi-bit output $y_{b1}$ of the delta-sigma modulator is an input signal for the swap element;
wherein an output signal $y_{b2}$ of the swap element is an input signal for the parallel-to-serial converter,
wherein the parallel-to-serial converter generates an output signal $y_{b3}$,
wherein the swap element, based on a last bit value 0 or 1 of a preceding word in the output signal $y_{b3}$, reverses a sequence of binary zeroes and ones of a current word, where present, and
wherein the delta-sigma modulator is configured to perform the functions of receiving an input signal having a frequency range above 25 kHz, oversampling the input signal at an oversampling ratio that lies between 7 and 15, and maintaining a high signal-to-noise ratio such that 1-0 and 0-1 transitions at word boundaries are substantially eliminated.

3. An apparatus comprising:
a delta-sigma modulator;
a parallel connection of K modulation tables connected to the delta-sigma modulator that each generate an output;
a multiplexer connected to the K modulation tables, said multiplexer being controlled by a control unit configured to select the output of the K modulation tables;
a parallel-serial converter connected to the multiplexer; and
a switching amplifier connected to the parallel-serial converter;
wherein the delta-sigma modulator is configured to perform the functions of receiving an input signal having a frequency range above 25 kHz, oversampling the input signal at an oversampling ratio that lies between 7 and 15, and maintaining a high signal-to-noise ratio such that 1-0 and 0-1 transitions at word boundaries are substantially eliminated.

4. The apparatus according to claim 1, wherein a quantizer is arranged at the output of the delta-sigma modulator, wherein said parallel-to-serial converter connected to the delta-sigma-modulator converts a multi-bit output signal of the quantizer with a sampling frequency $f_{DSM}$ at M bits in a PDM-like one-bit signal $y_{a2}$ with a sampling frequency $f_{PS,a}$, wherein at a constant frequency and in dependence of a respective adjacent multi-bit value of the input signal $y_{a1}$ for the parallel-to-serial converter, a duty cycle of the output signal $y_{a2}$ is modulated such that in each word of the output signal $y_{a2}$ a maximum of one alternation between binary ones and zeroes or zeroes and ones occurs.

5. The apparatus according to claim 4, wherein for reducing the switching frequency in the swap element connected to the parallel-to-serial converter an adaptive memory lossy swapping of pulses is performed such that the sequence of binary ones and zeroes of the pulse, where present, is reversed while the input signal $y_{a2}$ word is serially transferred to the output signal $y_{a3}$.

6. The apparatus according to claim 2, wherein a quantizer is arranged at the output of the delta sigma modulator, wherein a parallel output signal $y_{b1}$ of the quantizer is processed in the swap element by an adaptive memory lossy flipping of pulses in such a way that a sequence of binary ones and zeroes of the pulse, where present, is reversed while the input signal $y_{b1}$ word is serially transferred to the output signal $y_{b2}$.

7. The apparatus according to claim 6, wherein the parallel-to-serial converter connected to the swap element converts the multi-bit output signal $y_{b2}$ of the swap element with a sampling frequency $f_{DSM}$ at M bits in a PDM-like one-bit signal $y_{b3}$ with a sampling frequency $f_{PS,b}$, wherein at a constant frequency and in dependence of a respective adjacent multi-bit value of the input signal $y_{b2}$, a duty cycle of an output signal $y_{b3}$ is modulated such that in each word of the output signal $y_{b3}$ a maximum of one alternation between binary ones and zeroes or zeroes and ones occurs.

8. The apparatus according to claim 1, wherein at the input of the delta-sigma-modulator an oversampling with a specifiable oversampling factor takes place and wherein after the oversampling a filtering of the signal takes place in a loop filter, comprising a signal-transfer-filter for the input signal of the delta-sigma-modulator and a noise transfer filter for the feedback signal from the output of a quantizer of the delta-sigma modulator.

9. The apparatus according to claim 8, wherein the loop filter is of a class of RSR-filter with a NTF-filter of a higher order, having a transfer function $$H(z) = \frac{b_1 z^{-1} + b_2 z^{-2}}{1 - a_1 z^{-1} - a_2 z^{-2}}.$$

10. The apparatus according to claim 1, wherein the delta-sigma-modulator has a register that allows a flexible adaptation for reconfiguration of system parameters.

11. The apparatus according to claim 3, wherein control of the multiplexer is carried out memory lossy, systematically or randomly by the control unit.

12. A switching-type amplifier for a device according to claim 1, wherein the switching-type amplifier comprises two parallel branches, each with a series connection of a delay circuit, a matching pad for adjusting a supply voltage of a switching element, and a resonance driver for switching of the switching element, wherein in a DLL-like control loop, switching edges at an output of the resonance driver are tapped and fed to a phase comparator and wherein by means of a difference a regulating circuit determines a delay time and a delay circuit is adjusted accordingly.

13. A device for generating a variable power supply voltage range for a switching-type amplifier according to claim 12, wherein for determining a transmission power and an output power of the switching amplifier a current measurement takes place in known Ri at a switching element by means of a shunt, or takes place at a power supply for the switching amplifier, or takes place during active transmission at a carrier receiver channel of a communication system.

* * * * *